United States Patent [19]
Escher

[11] 4,210,463
[45] * Jul. 1, 1980

[54] MULTIMODE SOLAR ENERGY COLLECTOR AND PROCESS

[76] Inventor: William J. D. Escher, 506 S. Clinton Ave., St. Johns, Mich. 48879

[*] Notice: The portion of the term of this patent subsequent to Jan. 30, 1996, has been disclaimed.

[21] Appl. No.: 2,663

[22] Filed: Jan. 11, 1979

Related U.S. Application Data

[63] Continuation-in-part of Ser. No. 814,289, Jul. 11, 1977, Pat. No. 4,136,673.

[51] Int. Cl.$^2$ ............................ H01L 31/04; F24J 3/02
[52] U.S. Cl. ............................ 136/89 PC; 136/89 HY; 126/438; 126/439
[58] Field of Search ............... 126/270, 271; 237/1 A; 350/288, 289, 292, 293, 299; 136/89 HY, 89 PC

[56] References Cited

U.S. PATENT DOCUMENTS

| | | | |
|---|---|---|---|
| 2,969,788 | 1/1961 | Newton | 126/271 |
| 3,991,741 | 11/1976 | Northrup, Jr. et al. | 126/271 |
| 4,027,653 | 6/1977 | Meckler | 126/271 |
| 4,132,223 | 1/1979 | Reddell | 126/271 |
| 4,144,095 | 3/1979 | Mlavsky | 136/89 PC |

*Primary Examiner*—Aaron Weisstuch
*Attorney, Agent, or Firm*—Thomas W. Speckman

[57] ABSTRACT

A solar energy collector providing both concentrating-tracking functions and non-concentrating diffuse absorption functions in a single unit. The solar energy collector and process may provide both a higher temperature heat transfer fluid and a lower temperature heat transfer fluid for utilization in various processes, such as environmental conditioning, which may advantageously utilize thermal energy of two different temperatures. The solar energy thermal collector and process of this invention provides a high temperature thermal output in combination with a simplified tracking capability.

29 Claims, 11 Drawing Figures

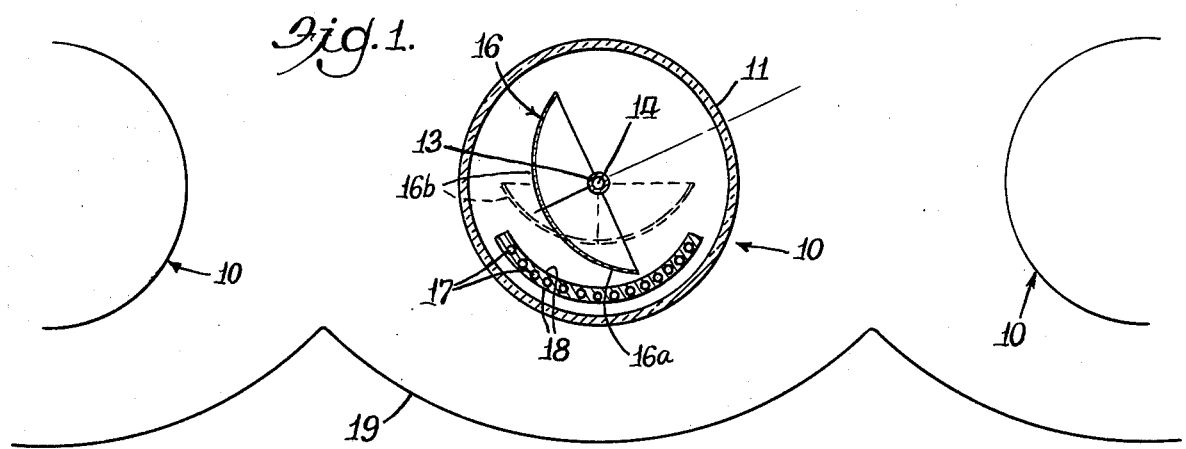
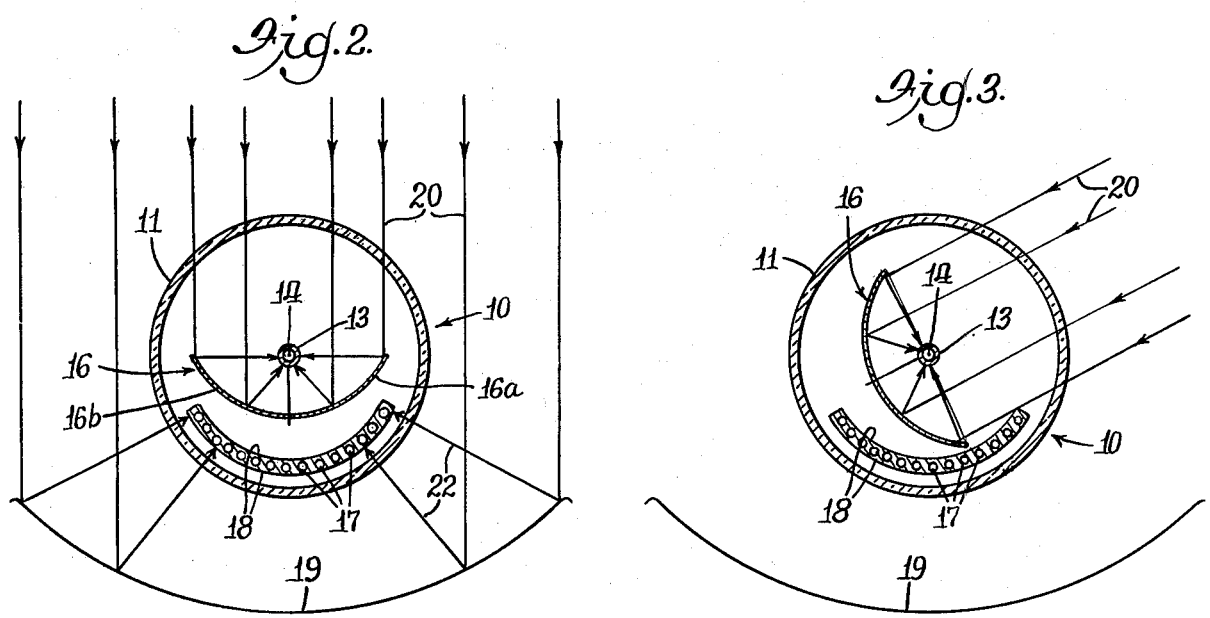
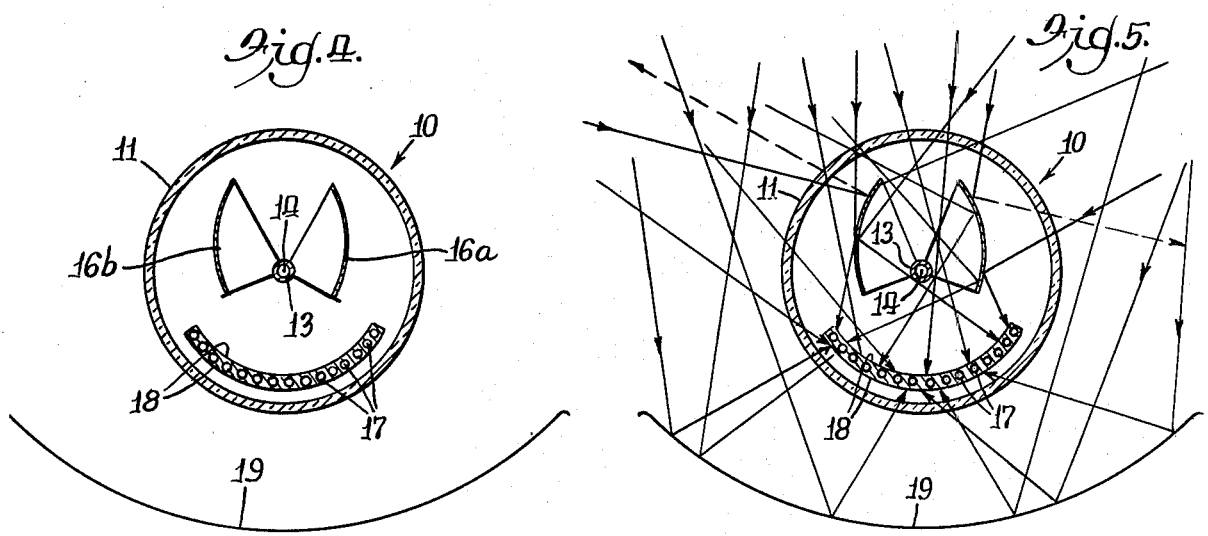

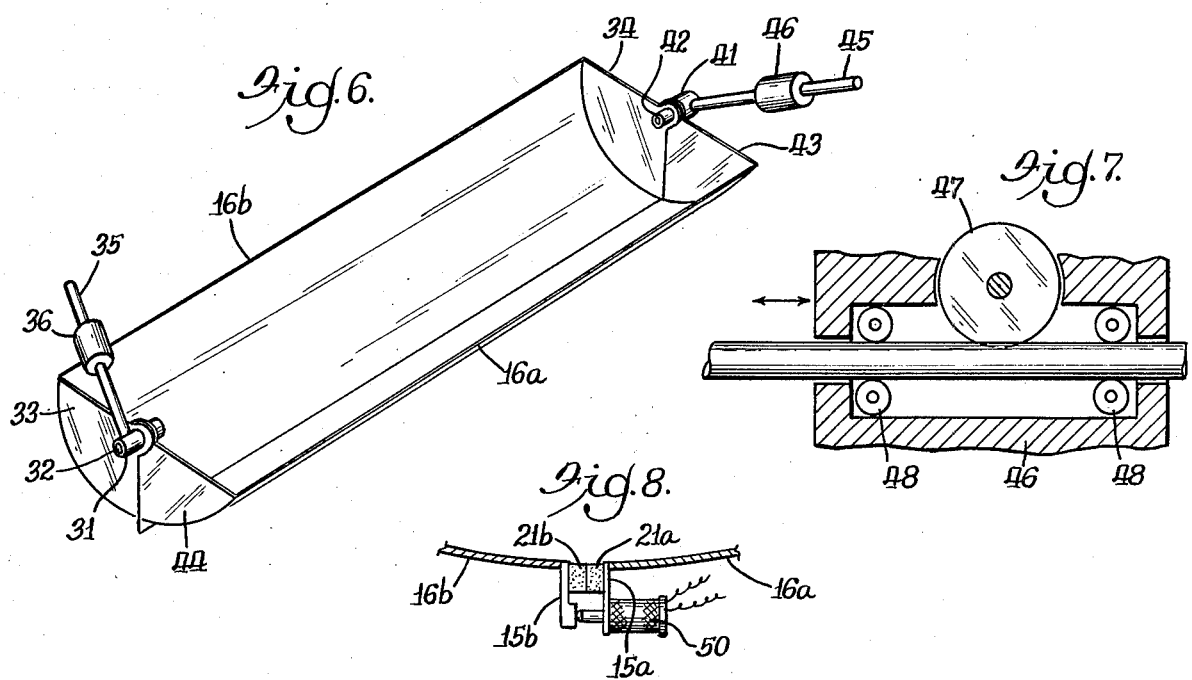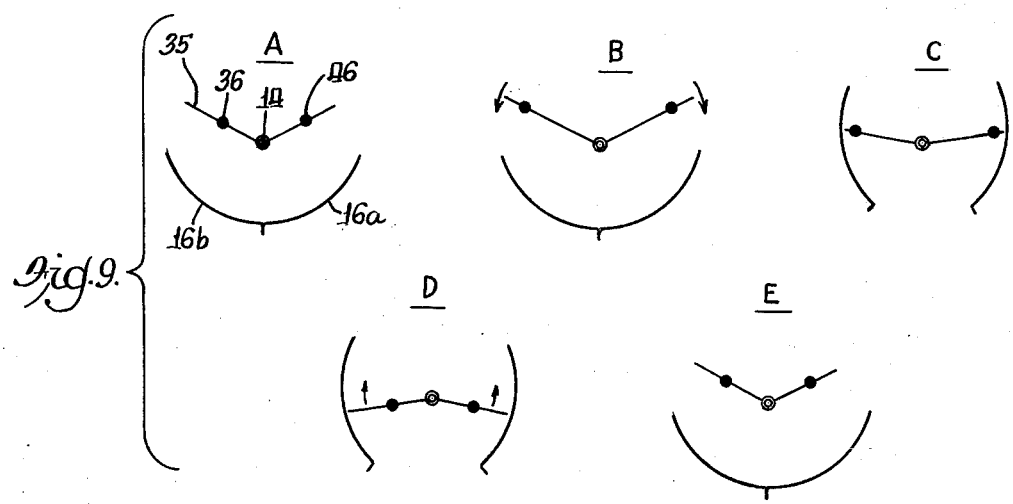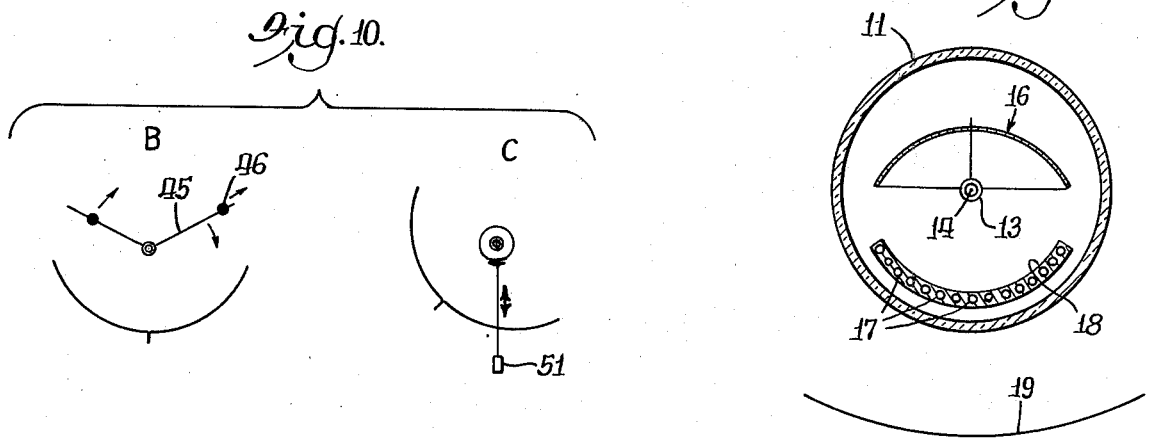

MULTIMODE SOLAR ENERGY COLLECTOR AND PROCESS

CROSS REFERENCE TO RELATED APPLICATION

This application is a continuation-in-part of my co-pending application Ser. No. 814,289 filed July 11, 1977, now U.S. Pat. No. 4,136,673.

This invention relates to an improved solar energy thermal collector which provides multimode collection capabilities. The collector of this invention may provide high temperature heat by absorption of concentrated direct solar radiation and lower temperature heat by absorption of diffuse solar radiation. The collector of this invention provides a concentrating-tracking function and a non-concentrating flat-plate function in a single unit.

The limited availability of primary energy sources and factors of pollution in the utilization of presently utilized primary energy sources makes considerations of utilization of solar energy desirable. Presently utilized solar energy collectors may be divided into two main categories, flat-plate collectors and focusing or concentrating collectors. Each of these types of collectors may be stationary or tracking with respect to its orientation to the angle of incidence of solar radiation. However, high concentration-ratio focusing collectors required for higher temperature heat must be capable of tracking the sun. A review of such collectors and their utilization in connection with heating, cooling and other energy utilization systems is described in "Solar Energy Thermal Process" by John A. Duffie and William A. Beckman, published by John Wiley & Sons, New York, 1974.

One commercially available flat-plate solar collector is more fully described in the PPG Industries, Inc. Technical Services Bulletin, "PPG Prototype Baseline Solar Collector". This is a double glazed hermetically sealed, non-tracking solar collector wherein a black absorbing surface is insulated from the back side and provided with fluid flow tubes for transfer of the absorbed thermal energy to a desired use or storage.

Another type of solar energy thermal collector is the Owens-Illinois, Inc. solar collector marketed under the trademark SUNPAK. The SUNPAK Solar Collector is a triple concentric tubular collector having a central heat transfer fluid feeder tube surrounded by an absorber tube coated with a selective absorber coating on its exterior surface. The heat transfer fluid flows in the space between the central feeder tube and the absorber tube to transfer thermal energy from the absorber. To the exterior of the absorber tube is a cover tube to protect the solar collector system from the weather, the space between the cover tube and the absorber tube being under a vacuum pressure of less than $10^{-4}$ mm of mercury. The tube collectors have a 360° aperture and therefore, may be advantageously spaced for maximum efficiency and the overall performance may be enhanced by reflecting surfaces behind the collector tubes. A series of these tubes may be mounted in appropriate manifold and support systems. However, the tubular solar collector of this type presents the disadvantages that at high sun angles only a fractional portion of the installed area is used due to the spacing between the absorber tubes. The tubular collectors do have the advantage that the absorbing surface always sees the solar source on a diameter and absorbs on a diameter, but has the disadvantage of radiating on the circumference of the absorber tube. A tubular collector having a metallic reflector focusing solar rays to a boiler tube at its focal line is taught by U.S. Pat. No. 1,880,938. However, the device of that patent does not suggest any utilization of diffuse absorption of solar energy.

In utilization of flat-plate collectors, the desirability of double glazing to reduce heat loss by convection has been recognized. Further, the desirability of vacuum between the absorber and the cover plate to reduce heat losses has been recognized, but in practice evacuation between flat double glazing presents problems due to the reinforcement necessary to support the flat double glazed structure.

Several types of concentrating solar collectors are commercially available or are presently under development. Both tracking and non-tracking types are included, with the tracking type generally employed since the non-tracking concentrating units are limited to relatively low concentration ratios and low maximum temperatures. An example is the Compound Parabolic Collector developed at the Argonne National Laboratory, Argonne, Illinois.

Higher temperatures can be achieved in single-axis tracking concentrating collectors of the lens or mirror type. An example of the lens type is the Northrup, Inc. Fresnel two dimensional lens system and the Polisolar, Ltd. (Switzerland) cylindrical parabolic mirror system, both of which are in commercial operation. These systems are usually configured with the single tracking axis lined up either on the East-West or North-South horizontal reference lines, or in an equatorial mounting in which the rotation axis is parallel with the Earth's axis. Alternatively, they may be set up in the plane of a slanted roof as may be convenient for mounting.

A modification of the single axis tracking system for a cylindrical parabolic reflector introduces a "slow motion" second axis at right angles to a north-south or equatorial type of orientation, or some intermediate positioning, providing for seasonal adjustments to maintain perpendicularity to the sun direction. An example is the "Suntrek" unit marketed by Alpha Solarco.

Still higher temperatures can be achieved by concentrating collectors of lens and mirror types based on shapes of rotation such as parabolic dish reflectors and conventional optical lenses, including Fresnel lenses. These units typically require two axis tracking systems of relatively high tracking accuracy. An array can be made up of such units which would be referred to as a "distributed" collector field. Alternatively, a "central collector" system can be used such as is commonly called the "power tower" concept. In this concept, a large number of two axis tracking heliostats, mirrors which are flat, or nearly so, track the sun in a manner as to focus on a centrally placed and elevated receiver.

A disadvantage of the concentrating systems described above, and similar systems which have been devised, is that the optical surfaces are directly exposed to environmental degradation such as the effects of sand and dust and certain chemical constituents in the air such as sulfur oxides. Wind-driven sand, for instance, poses a definite limitation to desert based solar energy systems of this type. Mirror systems, with their sensitive reflective surfaces, are particularly subject to such degradation. Physical damage by precipitation, particularly hail, can destroy the optical figure of such a reflecting surface. Another disadvantage of these concentrating collectors is their being subject to high loads and especially to high disturbing torques due to meteorological effects, particularly wind and snow. This requires added complicated structure in order to provide accurate tracking, safeguard the collectors and to provide for minimum damage in extreme weather situations.

It is an object of this invention to overcome the above disadvantages of prior solar thermal energy collectors.

It is yet another object of this invention to provide a solar thermal energy absorbing apparatus which provides both concentrating and non-concentrating collection functions in a single unit.

It is yet another object of this invention to provide a solar thermal energy collector which may furnish a portion of its output as high temperature heat and simultaneously and/or at other times when direct beam sunlight is not available, a portion of its output as lower temperature heat.

It is another object of this invention to provide a mechanically simple modular collector unit capable of being manufactured in high production numbers.

It is yet another object of this invention to provide a combination concentrating-tracking and non-concentrating diffuse absorber of solar energy which may also utilize the concentrating-tracking components to increase reflection of solar energy to the diffuse absorber.

It is yet another object of this invention to provide a rugged, long-life solar collector which is highly resistant to environmental degradation and damage, and which can be readily cleaned.

It is yet another object of this invention to provide for a physical configuration which is readily adaptable to the use of high vacuum techniques to reduce convective heat losses and to preserve the integrity of all optical films and coatings utilized in the solar collector module.

It is yet another object of this invention to provide for a standardized solar collector module which can readily be employed in a wide number of solar collector arrays and systems of various overall collector areas in a cost effective building block fashion.

It is yet another object of this invention to provide a modular solar collector unit which can be readily replaced in an overall collector system and further, were it to fail to function, would impact in minimal fashion on the performance of the remaining units.

It is yet another object of this invention to provide a multimode solar collector unit of high overall performance and one providing operating flexibility for use in advanced solar total energy systems.

It is yet another object of this invention to provide a solar collector unit which minimizes any adverse effects due to meteorological effects such as wind and precipitation effects and to eliminate or reduce disturbing torques about the concentrator-reflector rotation axis.

It is still another object of this invention to provide a solar energy collector with a simplified tracking mechanism and with a reduced tracking energy requirement.

These and other objects, advantages and features of this invention will be apparent from the description and by reference to the drawings wherein preferred embodiments are shown as:

FIG. 1 is a sectional view of a solar thermal energy collector unit according to one embodiment of this invention;

FIG. 2 is a schematic sectional view of a solar energy collector as shown in FIG. 1 showing the position of the concentrator-reflector in a "noontime" position with the solar source directly overhead;

FIG. 3 is a schematic sectional view of a solar energy collector as shown in FIG. 1 showing the position of the concentrator-reflector in a position with the solar source oblique to the surface of the earth;

FIG. 4 is a sectional view of a solar energy collector as shown in FIG. 1 showing the position of the concentrator-reflector halves for diffuse energy collection;

FIG. 5 is a schematic sectional view of a solar energy collector as shown in FIG. 4 showing diffuse energy collection;

FIG. 6 is a perspective view of one embodiment of a split concentrator-reflector according to this invention;

FIG. 7 is a partial sectional detail view of one embodiment of a traveling weight as shown in FIG. 6;

FIG. 8 is a partial sectional detail view of one embodiment of a latching and delatching mechanism for the split concentrator-reflector of this invention;

FIGS. 9A–E schematically show movement of the separate split concentrator-reflector by movement of weights according to one embodiment of this invention;

FIGS. 10B–C schematically show tracking movement of the concentrator-reflector by movement of weights according to one embodiment of this invention; and FIG. 11 is a schematic sectional view of a solar energy collector as shown in FIG. 1 showing the position of the concentrator-reflector in an "inactive" position.

My allowed parent application, Ser. No. 814,289, filed July 11, 1977, now U.S. Pat. No. 4,136,673, the disclosure of which is incorporated herein in total by reference, teaches a transparent tubular body with a concentrator-reflector within and in fixed relation to the tube reflecting direct solar energy to a high temperature focal-line absorber and also has a diffuse solar energy absorber within the tube in the path reflected or diffuse solar radiation providing a low temperature heat exchange fluid. For tracking the sun, the entire collector tube containing the collector components is rotated to achieve high collection. My parent application teaches that the focal-line absorber 13 may have any suitable "black body" absorber surface for solar energy absorption or any suitable coating for absorptents. I have found that the collector of my parent application and of this application is well suited for use as a concentrating photovoltaic system by having the absorber surface of the focal-line absorber 13 coated with a photovoltaic material or strips of photovoltaic cells for direct conversion of the solar energy to direct current electrical energy. Such photovoltaic coatings and cells are known to the art and are suitable for use as the absorber surface of the focal-line absorber. The central conduit of the focal-line absorber may be used as a passage for a coolant fluid for the photovoltaic material and to provide thermal energy from the solar energy absorber. The electricity produced may be used directly or stored by charging of batteries. The electrical conductance from the photovoltaic system to the exterior of the collector may be achieved by the focal-line absorber itself conducting the electrical energy from the collector or by wiring techniques readily apparent to one skilled in the art.

I have also found that the concentrator-reflector 16 may be rotated within the transparent envelope 11 for sun tracking and may be split into multiple components separately movable within the transparent envelope for enhanced collection of diffuse solar radiation. Details of this embodiment of my invention will be explained in greater detail.

FIG. 1 shows collector 10 in cross section according to one embodiment of this invention. The term "collector" as used in this description and in the claims refers to the entire collector unit 10 including the various components as will be described in more detail. Several such collectors may be mounted in spaced parallel relation within a collector mounting. Collector 10 has transparent body tube portion 11 and tube end closures sealed in fluid-tight relation at each end providing a fluid-tight cavity within the tube. The end closures may carry end shafts extending from the tube ends providing rotation about axis of rotation 14 for the embodiment more fully described in my parent application. For one of the embodiments to be more fully described in this application, the collector unit may remain stationary and the concentrator-reflector may rotate to provide suntracking. My invention relates to the multimode solar thermal energy collector. The mechanical means of mounting the tubes or the concentrator-reflectors and rotation of the tubes or concentrator-reflectors may be effected in a number of ways which are apparent to one skilled in the art and separately do not form an important part of this invention. Any suitable power means for obtaining the desired collector tube or concentrator-reflector rotation may be used, including internally produced power as with a combination photovoltaic converter electrical battery system.

FIG. 1 shows collector 10 having transparent envelope body portion 11. Concentrator-reflector 16 of cylindrical-paraboloid or parabolic-trough configuration optically is reflective on both sides and is in movable relation to tube 11 in the path of direct solar radiation and focuses the direct radiation on focal-line high temperature absorber 13 which is provided with means for removal of absorbed energy from the focal-line absorber to the exterior of the tube. This focusing can be direct without intermediate reflection, or indirect via a secondary smaller reflector, such that the high temperature absorber can be otherwise positioned than as shown in FIG. 1, to gain certain configurational advantage. For example, by means of such configurational folded optics advantage, the absorber could be located integrally with the primary concentrator-reflector, thus simplifying the unit. In this case, the secondary reflector would be a two dimensional contoured reflective strip located on or near the inner surface of the transparent tube in a line symmetrically opposite the primary reflector. Diffuse solar energy absorber 18 is in fixed relation to tube 11 and in the path of diffuse solar radiation received directly from the sky or by reflection, from within and without the collector, or re-radiation. Diffuse solar energy may be absorbed on both sides of absorber 18 which is in thermal exchange relation with low temperature fluid conduits 17.

As shown in FIG. 1, concentrator-reflector 16 is split along its long axis into multiple components separately movable in relation to the tube. In FIG. 1, concentrator-reflector 16 is made up of two halves, 16a and 16b. Concentrator-reflector 16 is movable about the axis of rotation 14 by any suitable moving means.

Reflective backing surface 19 reflects solar radiation which is not received by concentrating reflective surface 16 upward toward absorptive surface 18. Surface 19 can be either of a specular or polished, or a diffused optically white, nature. While reflective backing surface 19 is shown to be of suitable contoured shape, such as parallel parabolic surfaces to maximize the reflectance of the incoming radiation to the absorptive surface 18, the shape is dependent upon the spacing and orientation of adjacent solar collectors 10.

As shown in FIGS. 2 and 3, incoming direct (specular) solar radiation 20 strikes concentrating sun-oriented reflective surface 16 and is reflected in a concentrating fashion to focal-line high temperature absorber 13. Remaining direct and indirect radiation strikes reflective backing surface 19 and is transmitted as reflected radiation 22 toward absorber surface 18. As shown in FIGS. 2 and 3, the major portion of the incoming direct solar radiation is directed to focal-line high temperature absorber 13. When a heat transfer fluid is passed within focal-line high temperature absorber 13, temperatures of above about 300° F. may be achieved, depending primarily on the geometric concentration ratio. The geometric concentration ratio is the solar energy interception area of the concentrator-reflector 16 divided by the illuminated area of the focal-line high temperature absorber 13. Temperatures of about 300° to about 800° F. are attainable for the high temperature fluid in the focal-line absorber, about 350° to about 550° F. being the most practical temperatures. The focal-line absorber may also be coated with a photovoltaic material or strips of photovoltaic cells as are now or later become known to the art for direct conversion of the solar energy to direct current electrical energy. When operating in the photovoltaic mode, the electricity may be removed from the tube by any suitable means such as using the focal-line absorber itself as an electrical conductor or by wire means. For maintenance of high efficiencies, the photovoltaic material must not be allowed to become hot. The central conduit of the focal-line absorber may be used as a passage for coolant fluid for the photovoltaic material and also provide thermal energy from the absorber.

Non-concentrated diffuse solar radiation is absorbed by absorptive surfaces on both sides of diffuse absorber 18 and by thermal exchange warms heat transfer fluid passing within low temperature absorber conduits 17, attaining temperatures of about 150° to 350° F. The fluid passing through low temperature absorber conduits 17 may be withdrawn for use as a low temperature heat source or may then be directly passed as preheated fluid to the high temperature fluid conduit of the focal-line solar energy absorber 13.

When direct sunlight is not available, diffuse solar radiation can be collected on the upper surface of diffuse absorber 18 by rotating a one piece concentrator-reflector 16 away from its centered position to a position where concentrator-reflector 16 least interferes with diffuse radiation reaching diffuse absorber 18. FIGS. 4 and 5 show use of the multimode solar energy collector having a two-piece concentrator-reflector 16a and 16b positioned for collection of diffuse solar radiation. Concentrator-reflector 16 is divided into two portions and symmetrically rotated about axis of rotation 14 into the position shown in FIG. 4 for portions 16a and 16b. In the position shown in FIG. 4, diffuse solar radiation may be collected with high efficiency by diffuse solar energy absorber 18 as shown in FIG. 5. In this instance the two reflective surfaces of 16a and 16b reflect a portion of the incoming energy to diffuse absorber 18.

Movement of concentrator-reflector 16 in both the sun tracking mode as shown in FIGS. 2 and 3 and movement of multiple components of the concentrator-reflector, 16a and 16b, as shown in FIGS. 4 and 5, for the diffuse collection mode, may be achieved by any suitable moving means such as mechanical, magnetic, electromagnetic, for example, located either within the collector unit or outside of the collector unit. One mechanical means to achieve desired movement with all of the components located within the collector unit is shown in more detail in FIGS. 6 through 10.

FIG. 6 shows concentrator-reflector half 16a with end plates 43 and 44 mounted around bushing cylinders 41 and 31, respectively. Bushing cylinder 41 is in fixed relationship with respect to concentrator-reflector half 16a and bushing cylinder 31 is in fixed relationship with respect to concentrator-reflector half 16b. Holes 32 and 42 may be sized to be rotatably mounted about focal-line absorber 13. Arm 35 is attached in fixed relation to bushing cylinder 31 and arm 45 is attached in fixed relationship to bushing cylinder 41. Weights 36 and 46 are attached in movable relation along arms 35 and 45, respectively. In one embodiment, the weight may be driven along the arm by an internal motor drive as shown in more detail in FIG. 7, having motor means 47 in friction or geared relationship to the shaft, such as a rack and pinion drive. Rollers 48 are provided to enable easy movement of weight 46 along shaft 45. For use of concentrator-reflector 16 in the tracking mode, it is desired to have split halves 16a and 16b function as one concentrator-reflector unit 16 and a suitable latching mechanism may be provided as shown in FIG. 8. FIG. 8 shows flange 15a attached to concentrator-reflector half 16a and flange 15b attached to concentrator-reflector half 16b. Associated with the flanges is magnetic catch means 21 as shown co-functioning as 21a attached to flange 15a and 21b attached to flange 15b. When magnetic catch means 21a and 21b are in contact, the concentrator-reflector will operate as a single unit 16. When it is desired to have the concentrator-reflector split halves function separately, as for increasing collection of diffuse radiation, delatching means 50, such as an electromagnetic plunger, operates to separate magnetic latch portions 21a and 21b permitting each half of the concentrator-reflector to be separately controlled by movement of the traveling weight along the arm in fixed relation to that half.

FIG. 9A shows the concentrator-reflector 16 in balanced position, that is, weights 36 and 46 are positioned on arms 35 and 45, respectively, so that reflector halves 16a and 16b abut each other and concentrator-reflector 16 is in position for the sun to be directly overhead.

For tracking mode of operation, weight 46 can be moved outwardly on arm 45 as shown in FIG. 10B resulting in rotational forces upon concentrator-reflector 16 which rotate concentrator-reflector 16 clockwise as shown in FIG. 10C. Braking means 51 which, for example, may be an electromagnetically operated plunger device, may operate on one or both bushing cylinders, or attachments thereto, to control rotation of concentrator-reflector 16 as desired for tracking. It may be desirable to have a cylinder of larger radius of action for accuracy and minimizing of braking force. Any suitable braking means may be used. Tracking sensing means, not shown and well known to the art, may be used to successively release braking means 51 permitting intermittent rotation of concentrator-reflector 16 to achieve desired tracking. Concentrator-reflector 16 can be returned to the at rest or balanced position shown in FIG. 9A by simply returning the traveling weights to their balanced position and releasing the braking means. It is readily apparent that counterclockwise rotation may be achieved in the same manner by movement of weight 36 outwardly on arm 35 and that the rotational force may be altered in desired manners by movement of the traveling weights both inwardly and outwardly from their balanced positions. To increase the torque, when one weight is moved outwardly the other weight may be moved inwardly.

FIGS. 9B through 9E show movement of the split concentrator-reflector halves to the diffuse radiation collection mode. Both traveling weights are moved outwardly on their respective arms from the balanced position shown in FIG. 9A to an unbalanced position shown in FIG. 9B. Then the delatching means 50 is actuated and the concentrator-reflector halves 16a and 16b automatically travel to the positions, limited by mechanical stop or by braking, shown in FIG. 9C for collection of diffuse solar radiation as shown in FIG. 5. To return the concentrator-reflector halves to their balanced at rest position, the traveling weights are moved inwardly on their respective arms as shown in FIG. 9D and the concentrator-reflector halves returned to their abutting position as shown in FIG. 9E and maintained as a single concentrator-reflector unit by magnetic latching means 21 as shown in FIG. 8.

While the above description of FIGS. 6 through 10 explain in detail operation of one embodiment of this invention which may be wholly enclosed within collector unit 10, it is readily apparent to one skilled in the art that instead of moving weights along arms, mechanical gear means may be utilized or external magnetic means acting through the vacuum tight tube may be used to both rotate concentrator-reflector 16 in the tracking mode and to move the split halves 16a and 16b of concentrator-reflector for the diffuse collection mode. The electrical components described above, such as motor drive 47, de-latching means 50 and braking means 51 may be driven by batteries or photovoltaic cells within the individual collector unit or it would be readily apparent to one skilled in the art to provide electric power from outside of the collector unit.

To prevent undesired focusing of solar energy to focal-line absorber 13 and to shield diffuse absorber 18, concentrator-reflector 16 may be moved to the position shown in FIG. 11. This inactive mode is desired when working fluid is not being passed through focal-line absorber 13 or absorber conduits 17 or when electricity from a photovoltaic surface on absorber 13 is not desired The transparent body of the tubes for the multimode solar energy collector of this invention may be made from any suitable material including various glass and various plastic materials providing high transparency in the desired short wavelength range, low transparency in the thermal range and low reflectance and low absorption throughout the solar energy wavelength range. Any suitable coating or film known to the art may be applied to inside or outside surfaces to increase these properties or to improve durability or maintainability. For example, a thin fractional wavelength coating of magnesium fluoride may be applied to the outside surface to reduce reflective losses. Any anti-static coating may be applied to the outside surface to reduce dust collection.

For a preferred embodiment of this invention it is desired that the transparent body of the tubes provide sufficient mechanical strength to permit a vacuum within the tubes sufficiently low to significantly reduce convective heat losses. In practice, a vacuum of less than about $10^{-4}$ mm of mercury within the tubes is desirable and about $10^{-6}$ mm mercury is preferable and achievable. Suitable vacuums depending upon desired efficiency and tube diameter are in the order of about $10^{-3}$ mm of mercury to about $10^{-8}$ mm of mercury. The upper limit of the vacuum is governed only by materials, technical and economic conditions. By the terminology "tubular" I include cross sections which are round, elliptical or polygonal such as hexagonal, octagonal, and the like. The use of tubular shapes allows such vacuums within the tubes without requiring reinforcement. Further, the use of tubular shapes allows less thickness of glass or plastic than does flat double glazing and thereby reduces undesired glazing absorptance and refractive distortion.

The end closures may be any suitable material, usually metal or plastic or the same material as the transparent envelope, which provides the desired strength and mechanical configuration. The closure at at least one of the tube ends may provide suitable connections for the high temperature fluid conduit of focal-line absorber 13 and the low temperature fluid conduits 17 to exterior manifolds or other desired passage of heat transfer fluid to and from these conduits. One of the ends may simply be a continuous domed section of the transparent tube material not pierced for working fluid flow conduits and the heat transfer fluid introduced and removed from the same end by loop or concentric tube flow.

The concentrator-reflector 16 mounted within the solar energy collector which is reflective on both sides and reflective backing surface 19 may be any suitable metallic, synthetic or glass surface either made of or coated with a material having high reflectance in the solar spectral range. Such materials include chemically or electroplated silver, high purity aluminum, sputtered aluminum, optical reflectors, bytral processed aluminum, back-silvered glass, aluminum with silicon oxide coating, aluminum foil, back aluminized acrylic plates, aluminized Mylar sold by DuPont, or any other suitable material providing desired reflectance within the solar energy range. Unlike the case of other concentrating-type solar collectors, the concentrating reflective surface is protected from deterioration by the transparent tube and the high vacuum environment.

The focal-line absorber 13 and absorber surface 18 may have any suitable "black body" absorber surface. It is desired that the absorber have high absorptance for the received solar energy and low emittance for long-wave radiation at temperatures of the solar energy absorber. A number of "black" surfaces are known to include various "nickel black", "chrome black", "copper black" and other known selective surfaces for solar energy absorption such as summarized in Table 5.6.1 of the book referred to above, "Solar Energy Thermal Processes". The absorber must also conduct the absorbed thermal energy to heat transfer fluid which may be in contact with the absorber in any suitable fashion. For example, in FIG. 1, fluid conduits 17 are shown as tubes within a metal matrix with absorber surfaces 18 being the exterior of the matrix, but it should be clear that the conduits may have any number of alternative configurations such as being passages in an expanded metal sheet which is coated for absorptance.

Any suitable configuration of heat transfer fluid flow may be utilized including single and multiple pass and coaxial flow. The heat transfer fluid with the absorbed energy from the solar energy absorber may be removed from the collectors and passed in any desired fashion to an energy storage means or to direct utilization in any desired process, such as electricity generating, heating or air conditioning applications. It is one feature of this invention that a higher and lower temperature heat source, as in a solar total energy system, may be supplied to processes utilizing or requiring different temperature levels of thermal energy input.

A cover plate may be provided to the exterior of the collector tubes for weather protection and reduction of convective loss. The cover plate may be made of any suitable material which provides high transparency, low reflectance and low absorption with low refraction in the incident beam solar energy wavelengths. Suitable glass and plastic materials are known for this purpose.

FIG. 1 schematically shows the relationship of multiple parallel multimode solar energy collectors according to this invention in the concentrating-tracking mode of operation. A tracking system provides rotation of the concentrator-reflectors to maximize concentration and effects focusing of the solar energy on the focal-line absorber. Rotation of the concentrator-reflector may be continuous or intermittent to the extent desired to obtain the best average orientation angle. The time and incident angles of solar radiation at various points on the earth are known and the desired rotation of the concentrator-reflectors may be readily ascertained by one skilled in the art. Likewise, the mechanism for rotation of the concentrator-reflector may be readily adapted from the state of the art and applied to the apparatus of this invention. Further, energy radiated away from one collector unit may be directly or indirectly received by another collector unit. The two modes of energy absorption may provide lower temperature heat transfer fluid in absorber conduits 17 and higher temperature heat transfer fluid in the focal-line absorber 13 when direct solar radiation is available.

While in the foregoing specification this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

I claim:

1. A multimode solar energy collector comprising: a transparent tubular body portion having end closures sealing each end of said body portion providing a fluid-tight cavity within the tube, a concentrator-reflector within the tube, a focal-line solar energy absorber in the focus of said concentrator-reflector, means for removal of absorbed energy from said focal-line solar energy absorber to the exterior of said tube, a diffuse solar energy absorber within the tube adapted to be in the path of reflected or diffuse solar radiation, a low temperature fluid conduit in thermal exchange relation with said diffuse solar energy absorber, heat exchanger fluid in said conduit and means for introducing and withdrawing the heat exchange fluid from said collector, said concentrator-reflector adapted to be in the path of direct solar radiation and focusing said direct radiation to said focal-line absorber and said diffuse absorber adapted to be in the path of reflected or diffuse solar radiation.

2. The multimode solar energy collector of claim 1 wherein said cavity is evacuated to about $10^{-3}$ mm to about $10^{-8}$ mm of mercury.

3. The multimode solar energy collector of claim 1 wherein said focal-line solar energy absorber is coated with a selective coating enhancing absorption of solar energy of the wavelengths received by said focal-line absorber.

4. The multimode solar energy collector of claim 1 wherein said focal-line energy absorber is coated with a photovoltaic material or fitted with photovoltaic cells directly converting the solar energy into electrical energy.

5. The multimode solar energy collector of claim 1 wherein said concentrator-reflector is in movable relation to the tube.

6. The multimode solar energy collector of claim 5 wherein said concentrator-reflector is split along its long axis into multiple components separately movable in relation to the tube.

7. The multimode solar energy collector of claim 6 wherein said concentrator-reflector is split along its long axis into two halves separately movable in relation to the tube.

8. The multimode solar energy collector of claim 5 additionally having moving means for moving said concentrator-reflector.

9. The multimode solar energy collector of claim 8 wherein said moving means is a movable weight within said tube.

10. The multimode solar energy collector of claim 8 wherein said moving means is a movable magnetic body exterior to said tube.

11. A multimode solar energy collector assembly comprising:
a series of parallel multimode solar energy collectors each comprising; a transparent tubular body portion having end closures sealing each end of said body portion providing a fluid-tight cavity within the tube, a concentrator-reflector within the tube, a focal-line solar energy absorber in the focus of said concentrator-reflector, means for removal of absorbed energy from said focal-line solar energy absorber to the exterior of said tube, and a diffuse solar energy absorber within the tube adapted to be in the path of reflected or diffuse solar radiation, a low temperature fluid conduit in thermal exchange relation with said diffuse solar energy absorber, heat exchange fluid in said conduit and means for introducing and withdrawing the heat exchange fluid from said collector, said concentrator-reflector adapted to be in the path of direct solar radiation and focusing said direct radiation to said focal-line absorber and said diffuse absorber adapted to be in the path of reflected or diffuse solar radiation;
a collector mounting means for mounting each of said collectors;
moving means providing tracking-rotation of each said concentrator-reflector; and
a reflective backing surface below each said collector adapted to reflect solar radiation upward toward each said collector.

12. The multimode solar energy collector assembly of claim 11 wherein each said focal-line solar energy absorber is coated with a selective coating enhancing absorption of solar energy of the wavelengths received by each said focal-line absorber.

13. The multimode solar energy collector assembly of claim 11 wherein each said focal-line energy absorber is coated with a photovoltaic material or fitted with photovoltaic cells directly converting the solar energy into electrical energy.

14. The multimode solar energy collector assembly of claim 11 wherein each said concentrator-reflector is in movable relation to its respective tube.

15. The multimode solar energy collector assembly of claim 14 wherein each said concentrator-reflector is split along its long axis into multiple components separately movable in relation to its respective tube.

16. The multimode solar energy collector assembly of claim 15 wherein each said concentrator-reflector is split along its long axis into two halves separately movable in relation to its respective tube.

17. The multimode solar energy collector assembly of claim 14 additionally having moving means for moving each said concentrator-reflector.

18. The multimode solar energy collector assembly of claim 17 wherein said moving means is a movable weight within each said tube.

19. The multimode solar energy collector assembly of claim 17 wherein said moving means is a movable magnetic body exterior to each said tube.

20. The multimode solar energy collector assembly of claim 11 wherein each said cavity is evacuated to about $10^{-3}$ mm to about $10^{-8}$ mm of mercury.

21. A process for multimode solar energy absorption comprising; maintaining a focal-line solar energy absorber in the focus of a concentrator-reflector, both being in a fluid-tight cavity within a transparent tube, placing said concentrator-reflector in the path of direct solar radiation, focusing said direct solar radiation to said focal-line absorber, removing absorbed energy from said focal-line absorber to the exterior of said tube, and passing heat exchange fluid in thermal exchange relation with a diffuse solar absorber within said cavity, diffuse solar radiation being reflected to said diffuse absorber.

22. The process of claim 21 wherein said focal-line solar energy absorber is coated with a selective coating enhancing absorption of solar energy of the wavelengths received by said focal-line absorber.

23. The process of claim 21 wherein said focal-line energy absorber is coated with a photovoltaic material or fitted with photovoltaic cells directly converting the solar energy into electrical energy.

24. The process of claim 21 wherein said concentrator-reflector is in movable relation to the tube.

25. The process of claim 24 wherein said concentrator-reflector is split along its axis into multiple components separately movable in relation to the tube.

26. The process of claim 25 wherein said concentrator-reflector is split along its long axis into two halves separately movable in relation to the tube, each of said halves movable to a position for reflection from each side of a portion of incoming diffuse solar energy to the upper surface of said diffuse solar absorber and said position allowing direct diffuse solar radiation to be absorbed by the upper surface of said diffuse solar absorber.

27. The process of claim 24 wherein said concentrator-reflector is moved by a movable weight within said tube.

28. The process of claim 24 wherein said concentrator-reflector is moved by a movable magnetic body exterior to said tube.

29. The process of claim 21 wherein said cavity is evacuated to about $10^{-3}$ to about $10^{-8}$ mm of mercury.

* * * * *